US008031189B2

(12) United States Patent
Lee

(10) Patent No.: US 8,031,189 B2
(45) Date of Patent: Oct. 4, 2011

(54) DATA DRIVER CIRCUIT AND DELAY-LOCKED LOOP CIRCUIT

(75) Inventor: Yong-Jae Lee, Yongin-si (KR)

(73) Assignee: Anapass Inc., Seoul (KR)

( * ) Notice: Subject to any disclaimer, the term of this patent is extended or adjusted under 35 U.S.C. 154(b) by 617 days.

(21) Appl. No.: 12/234,496

(22) Filed: Sep. 19, 2008

(65) Prior Publication Data

US 2009/0079719 A1    Mar. 26, 2009

(30) Foreign Application Priority Data

Sep. 20, 2007   (KR) .................. 10-2007-0095799

(51) Int. Cl.
*G06F 3/038*   (2006.01)
(52) U.S. Cl. ...................................... 345/204
(58) Field of Classification Search ................ 345/204
See application file for complete search history.

(56) References Cited

U.S. PATENT DOCUMENTS

| | | | |
|---|---|---|---|
| 5,663,665 A * | 9/1997 | Wang et al. ................ | 327/3 |
| 6,256,003 B1 | 7/2001 | Tsuchiya et al. | |
| 6,304,116 B1 | 10/2001 | Yoon et al. | |
| 6,396,888 B1 | 5/2002 | Notani et al. | |
| 7,015,973 B2 | 3/2006 | Kim | |
| 7,073,098 B2 * | 7/2006 | Kozaki ...................... | 714/700 |
| 7,812,656 B2 * | 10/2010 | Lee ........................... | 327/158 |
| 2008/0246755 A1 * | 10/2008 | Lee ........................... | 345/214 |

FOREIGN PATENT DOCUMENTS

| | | |
|---|---|---|
| JP | 10-260663 | 9/1998 |
| JP | 10-285019 | 10/1998 |
| JP | 11-074878 | 3/1999 |
| JP | 2000-224029 | 8/2000 |
| JP | 2003-177734 | 6/2003 |

* cited by examiner

*Primary Examiner* — Richard Hjerpe
*Assistant Examiner* — Andrew Schnirel
(74) *Attorney, Agent, or Firm* — Sherr & Vaughn, PLLC

(57) ABSTRACT

A data driver circuit and a delay-locked loop (DLL) circuit that can operate normally in spite of errors, etc., caused when an analog data signal is applied to a display panel are provided. The data driver circuit receives a first data signal and a first clock signal and outputs a second data signal to be transmitted to a display panel. The data driver circuit includes a data driver for sampling the first data signal in response to a second clock signal and outputting the second data signal obtained by analog-converting the first data signal, a mask signal generator for generating a mask signal indicating presence within a predetermined time period measured from a point in time at which the second data signal begins to change, and a DLL for generating the second clock signal from the first clock signal. Here, there is a delay between the first and second clock signals, the delay changes according to a phase difference between the first and second clock signals, and the change in the delay according to the phase difference is prevented by the mask signal.

18 Claims, 8 Drawing Sheets

[FIG.1]
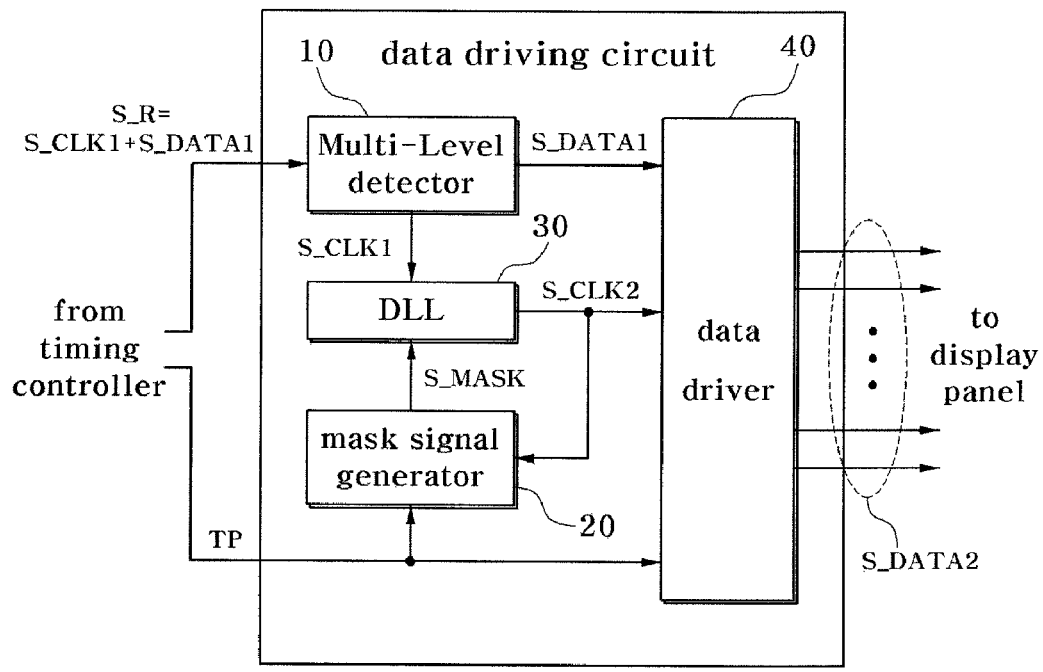
[FIG.2]
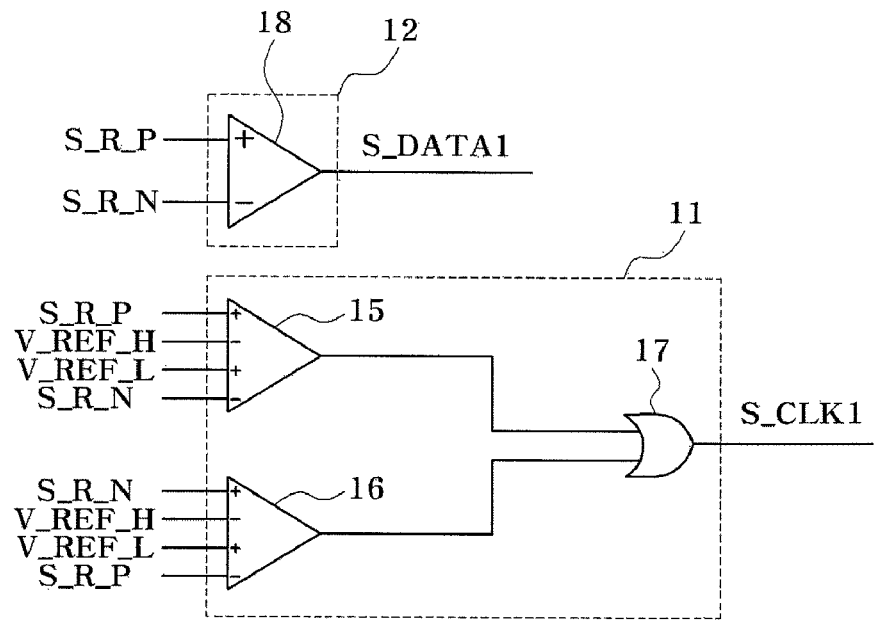

[FIG.3]
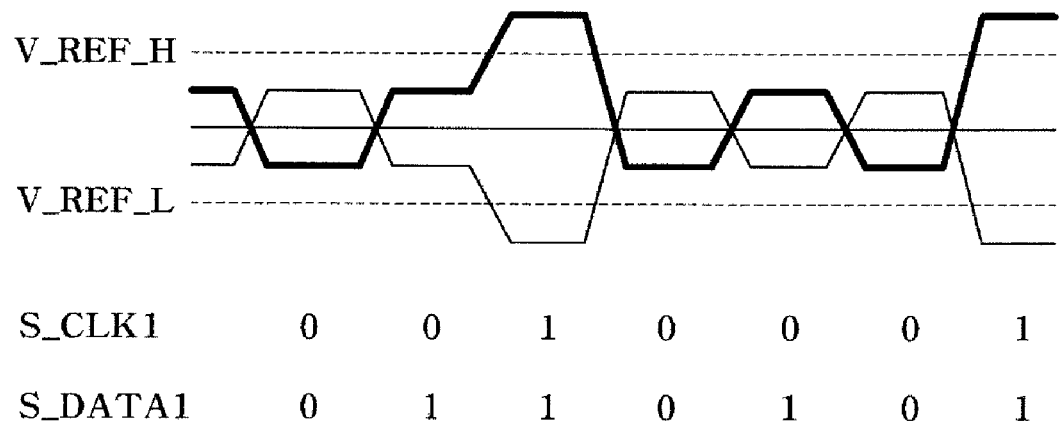
[FIG.4]
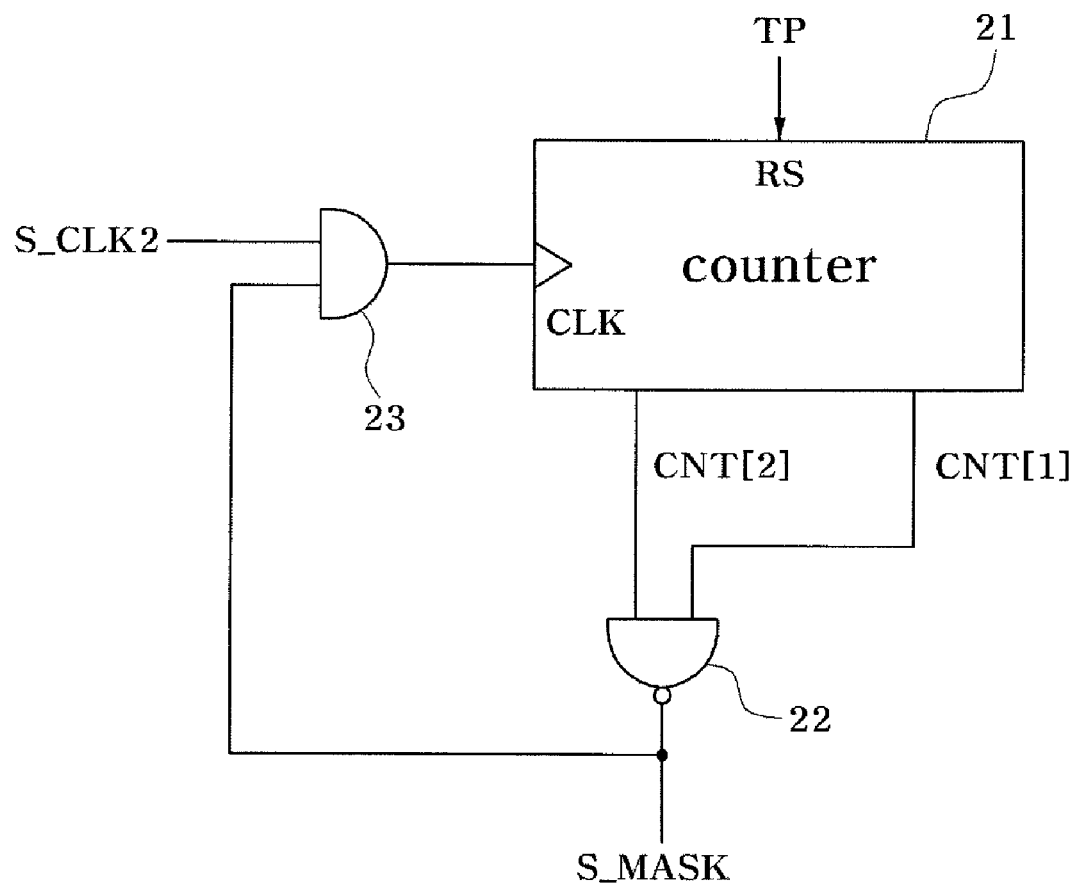

[FIG.5]
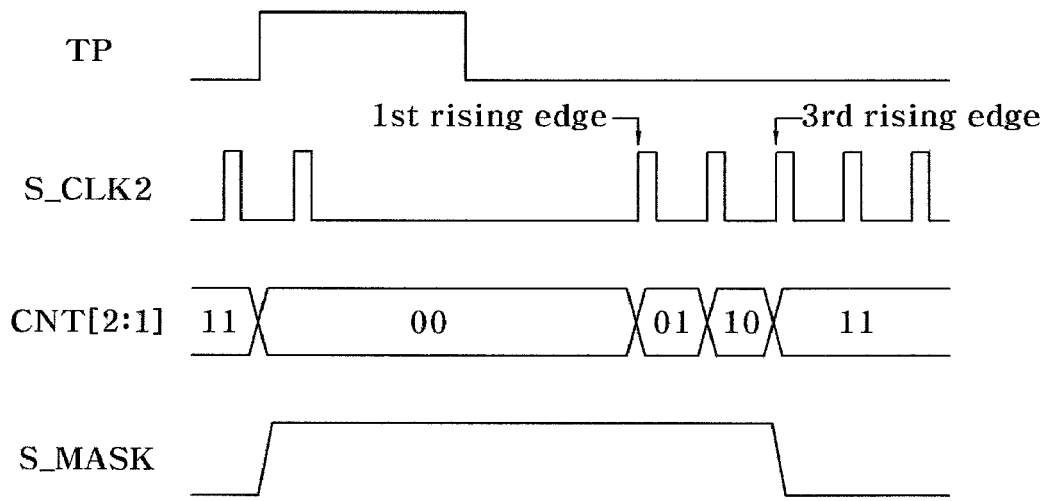
[FIG.6]
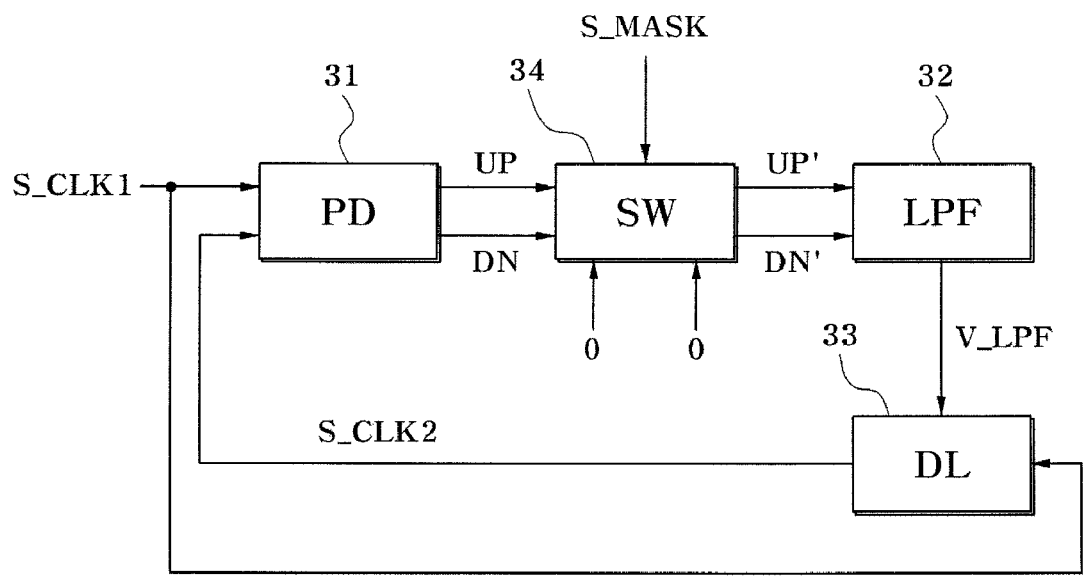

[FIG.7]
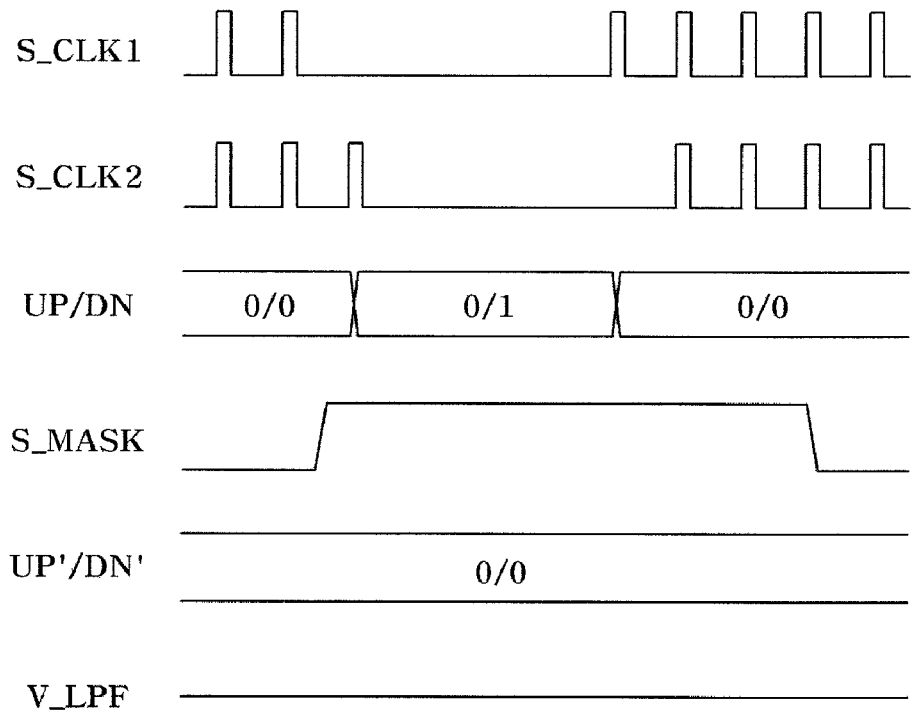
[FIG.8]
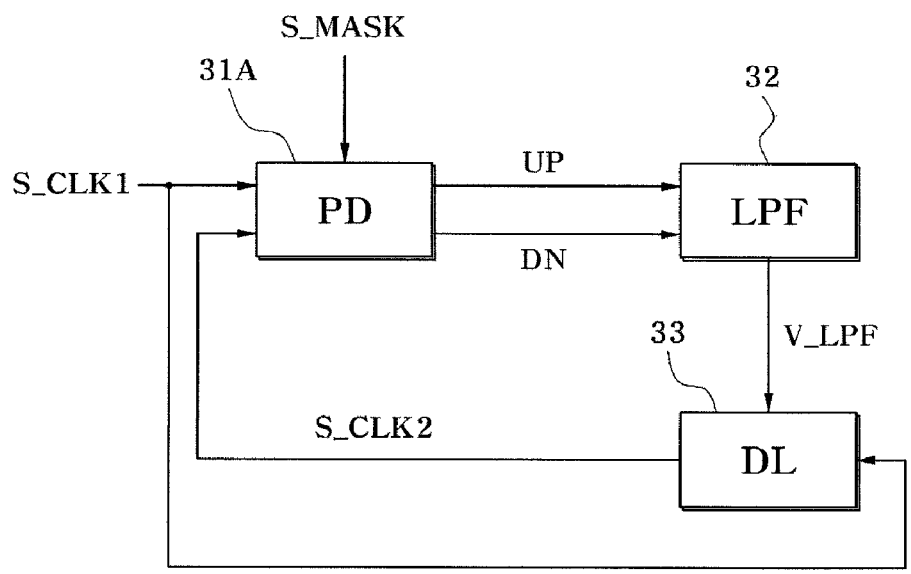

[FIG.9]
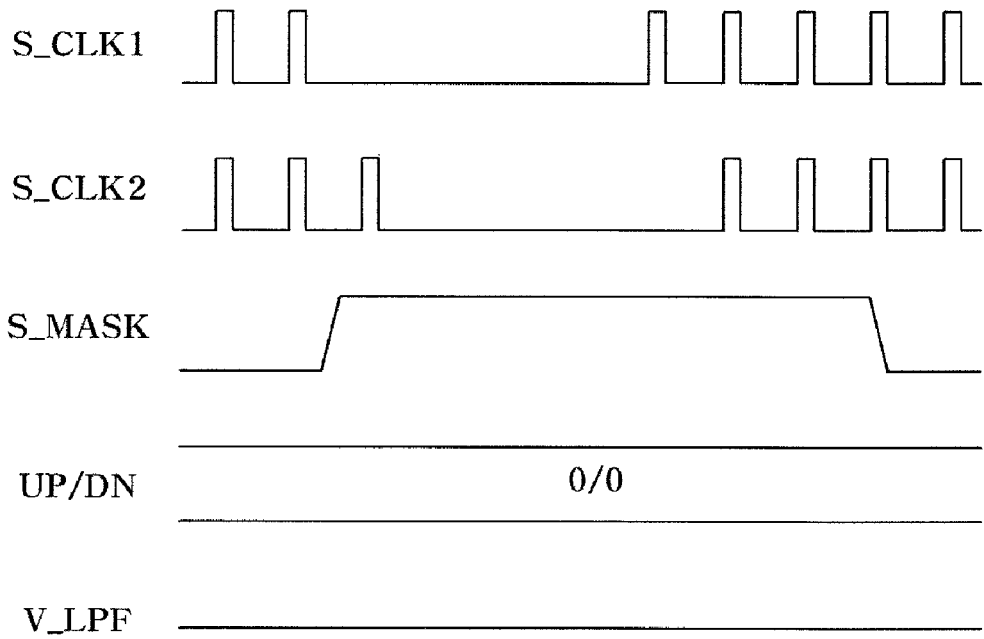
[FIG.10]
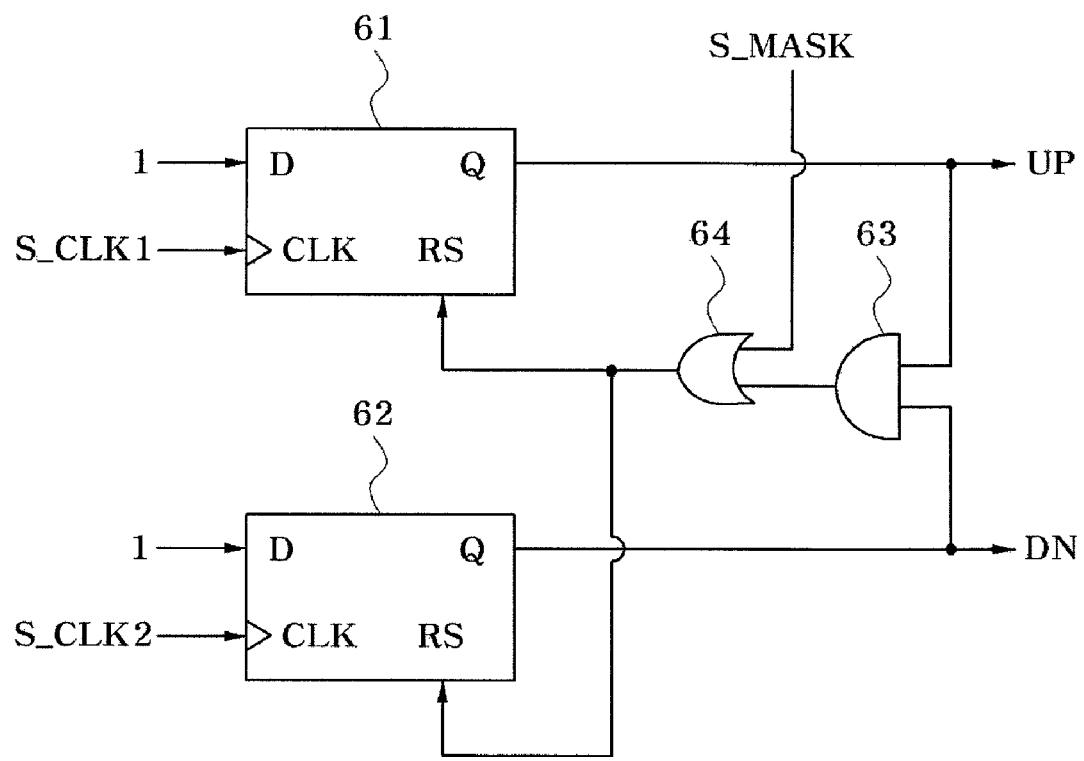

[FIG.11]
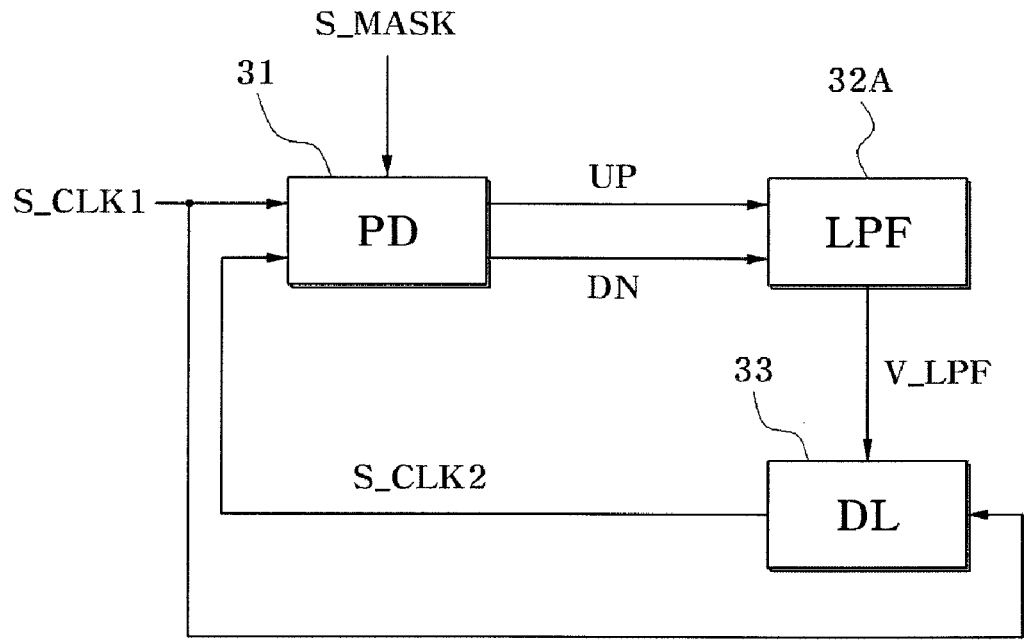
[FIG.12]
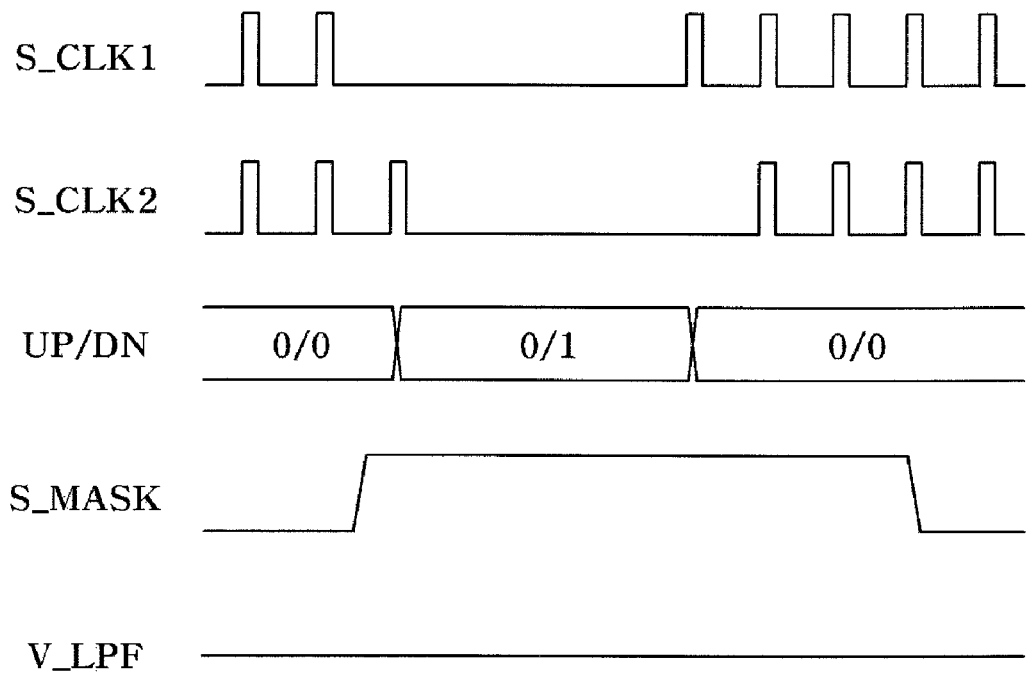

[FIG.13]
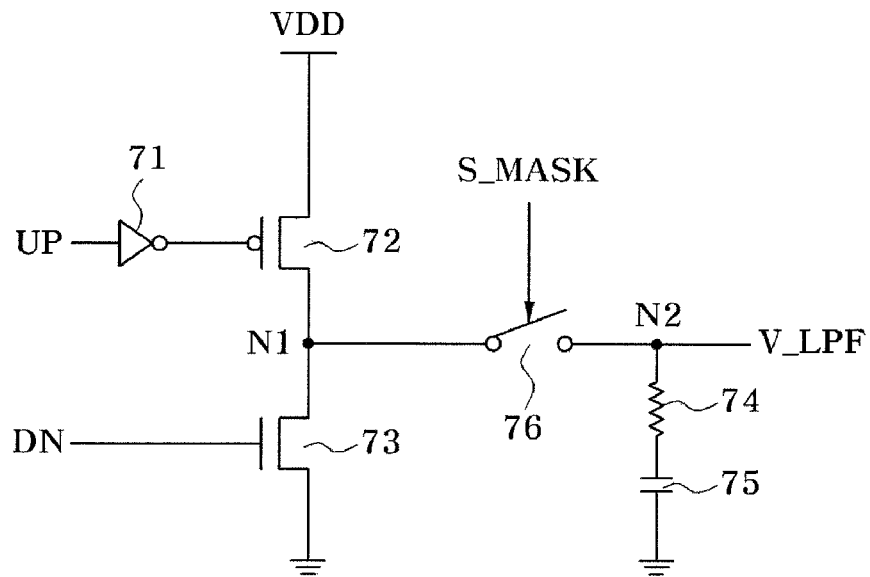
[FIG.14]
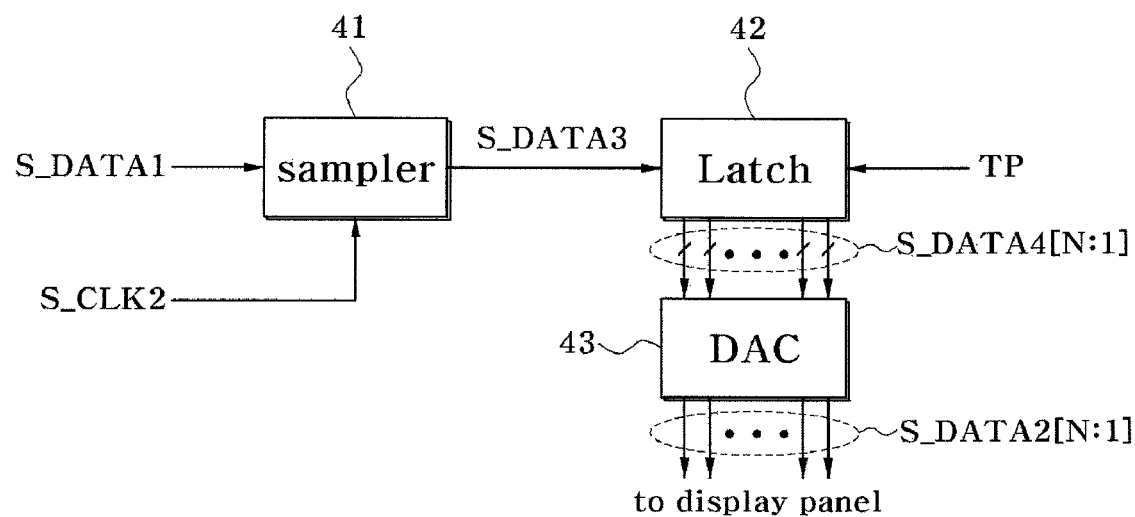

[FIG.15]
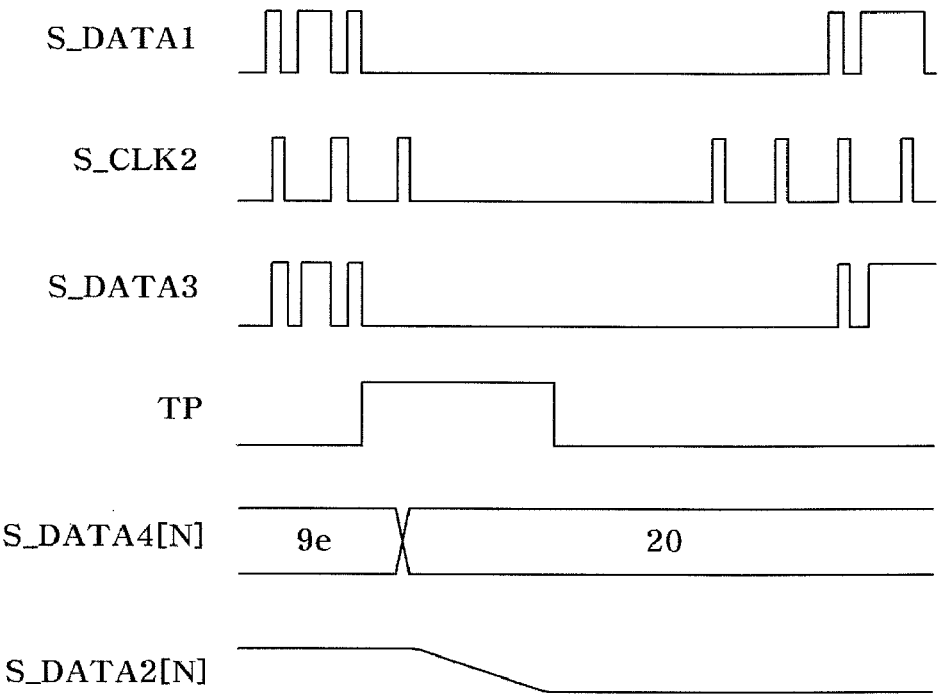
[FIG.16]
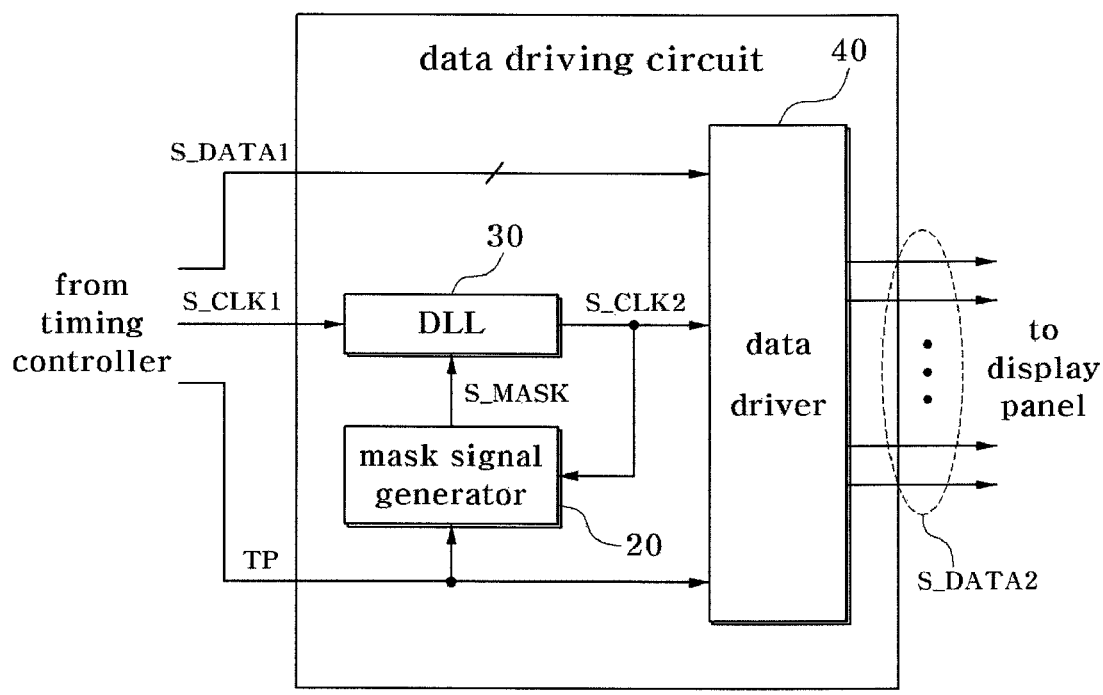

DATA DRIVER CIRCUIT AND DELAY-LOCKED LOOP CIRCUIT

CROSS REFERENCE TO RELATED APPLICATIONS

This application claims priority from Korean Patent Application No. 10-2007-0095799, filed on Sep. 20, 2007, the disclosure of which is incorporated herein in its entirety by reference.

BACKGROUND OF THE INVENTION

1. Field of the Invention

The present invention relates to a data driver circuit and a delay-locked loop (DLL) circuit, and more particularly, to a data driver circuit and a DLL circuit capable of operating normally in spite of an error, etc., caused when an analog data signal is applied to a display panel.

2. Discussion of Related Art

A data driver circuit functions to apply an analog data signal corresponding to a data signal transmitted from a timing controller to a display panel. The data driver circuit receives a clock signal (also referred to as a horizontal synchronization signal) synchronized with the data signal, together with the data signal from the timing controller, and may include a DLL to restore the original clock signal from the received clock signal. Meanwhile, when the analog data signal output from the data driver circuit to the display panel is changed, a large current momentarily flows from the data driver circuit to the display panel and causes noise in the data driver circuit (for example, the current momentarily changes a power supply voltage and/or ground voltage of the data driver circuit). Due to the noise, one or more clocks of a received clock signal input to the DLL may be lost, which may unlock the DLL. Once the DLL is unlocked, it takes a considerable amount of time to lock it again. Thus, errors in a received clock signal occurring within a short period of time have long-lasting repercussions due to unlocking of the DLL.

SUMMARY OF THE INVENTION

The present invention provides a data driver circuit capable of keeping a delay-locked loop (DLL) locked even if some clocks of a received clock signal are lost due to a change of an analog data signal applied from the data driver circuit to a display panel, and a DLL circuit that can be used in the data driver circuit.

According to an example embodiment of the present invention, a data driver circuit that receives a first data signal and a first clock signal and outputs a second data signal to be transmitted to a display panel includes: a data driver for sampling the first data signal according to a second clock signal, obtaining the second data signal by analog-converting the first data signal, and outputting the second data signal; a mask signal generator for generating a mask signal indicating presence within a predetermined time period measured from a point in time at which the second data signal begins to change; and a DLL for generating the second clock signal from the first clock signal, wherein there is a delay between the first and second clock signals, the delay changes according to a phase difference between the first and second clock signals, and the change in the delay according to the phase difference is prevented by the mask signal.

According to another example embodiment of the present invention, a DLL circuit includes: a DLL for generating a second clock signal from a first clock signal, wherein there is a delay between the first clock signal and the second clock signal that changes according to a phase difference between the first clock signal and the second clock signal; and a mask signal generator for transmitting a mask signal that prevents the delay from changing according to the phase difference.

BRIEF DESCRIPTION OF THE DRAWINGS

The above and other objects, features and advantages of the present invention will become more apparent to those of ordinary skill in the art by describing in detail example embodiments thereof with reference to the attached drawings, in which:

FIG. 1 is a block diagram of a data driver circuit according to a first example embodiment of the present invention, illustrating a case in which a first clock signal is embedded in a first data signal with a different signal magnitude;

FIG. 2 illustrates an example of a multi-level detector employed in the data driver circuit of FIG. 1;

FIG. 3 is a timing diagram of received signals, reference voltages, a first clock signal and a first data signal of FIG. 2;

FIG. 4 illustrates an example of a mask signal generator employed in the data driver circuit of FIG. 1;

FIG. 5 is a timing diagram of a load signal, a second clock signal, a mask signal and a counter output of FIG. 4;

FIG. 6 illustrates an example of a delay-locked loop (DLL) employed in the data driver circuit of FIG. 1;

FIG. 7 is a timing diagram of signals of FIG. 6 including the first clock signal, the second clock signal, signals corresponding to a phase difference output from a phase detector, the mask signal, signals corresponding to a phase difference output from a switch, and an output of a low-pass filter (LPF);

FIG. 8 illustrates another example of the DLL employed in the data driver circuit of FIG. 1.

FIG. 9 is a timing diagram of signals of FIG. 8 including the first clock signal, the second clock signal, the signals corresponding to a phase difference output from a phase detector, the mask signal and the output of an LPF;

FIG. 10 illustrates an example of a phase detector employed in FIG. 8;

FIG. 11 illustrates yet another example of the DLL employed in the data driver circuit of FIG. 1;

FIG. 12 is a timing diagram of signals of FIG. 11 including the first clock signal, the second clock signal, the signals corresponding to a phase difference output from a phase detector, the mask signal and the output of an LPF;

FIG. 13 is an example of a circuit diagram of an LPF employed in FIG. 11;

FIG. 14 illustrates an example of a data driver employed in the data driver circuit of FIG. 1;

FIG. 15 is a timing diagram of first to fourth data signals, the second clock signal and the load signal of FIG. 14; and FIG. 16 is a block diagram of a data driver circuit according to a second example embodiment of the present invention, illustrating a case in which a first clock signal and a first data signal are received through different signal lines.

DETAILED DESCRIPTION OF EXAMPLE EMBODIMENTS

Hereinafter, example embodiments of the present invention will be described in detail. However, the present invention is not limited to the embodiments disclosed below but can be implemented in various modified forms. The following embodiments are described in order to fully enable those of ordinary skill in the art to embody and practice the present invention.

FIG. 1 is a block diagram of a data driver circuit according to a first example embodiment of the present invention, illustrating a case in which a first clock signal is embedded in a first data signal with a different signal magnitude.

Referring to FIG. 1, the data driver circuit includes a multi-level detector 10, a mask signal generator 20, a delay-locked loop (DLL) 30 and a data driver 40.

The multi-level detector 10 functions to extract a first clock signal S_CLK1 from a received signal S_R. The multi-level detector 10 may also extract a first data signal S_DATA1 from the received signal S_R. The received signal S_R includes the first clock signal S_CLK1 and the first data signal S_DATA1. The first clock signal S_CLK1 is embedded in the first data signal S_DATA1 with a different signal magnitude from the first data signal S_DATA1. Therefore, it is possible to extract the first clock signal S_CLK1 from the received signal S_R using the magnitude or level of the received signal S_R. In addition, the first data signal S_DATA1 can be extracted from the received signal S_R using the polarity or sign of the received signal S_R. The received signal S_R is transmitted from a timing controller (not shown). The received signal S_R may be transmitted by single-ended signaling using one interconnection connecting the timing controller with the data driver circuit, or by differential signaling using two interconnections. The differential signaling method may be, for example, low-voltage differential signaling (LVDS).

The mask signal generator 20 generates a mask signal S_MASK that indicates presence within a predetermined period measured from a point in time at which a second data signal S_DATA2 begins to change. The mask signal S_MASK may be generated before or at the point in time at which the second data signal S_DATA2 begins to change, and may be maintained for a predetermined period measured from the point in time at which the second data signal S_DATA2 begins to change. The mask signal generator 20 may generate the mask signal S_MASK in response to a load signal TP. The load signal TP controls the data driver 40 to change the second data signal S_DATA2. For example, when the load signal TP is applied, the mask signal S_MASK is generated, and the generated mask signal S_MASK may be maintained for three clocks of the second clock signal S_CLK2. The load signal TP is applied from, for example, the timing controller. The load signal TP may be transmitted through a separate interconnection as illustrated in FIG. 1, or through the same interconnection as the first clock signal S_CLK1 and the first data signal S_DATA1 unlike FIG. 1. For example, the load signal TP may be extracted from the polarity of the first clock signal S_CLK1.

The DLL 30 derives the second clock signal S_CLK2 from the first clock signal S_CLK1. There is a delay between the first and second clock signals S_CLK1 and S_CLK2 that changes according to a phase difference between them. However, the delay is not changed according to the phase difference while the mask signal S_MASK is applied. This means that the delay is not dependent on the phase difference between the first and second clock signals S_CLK1 and S_CLK2, but does not mean that the delay has a fixed value.

The data driver 40 samples the first data signal S_DATA1 according to the second clock signal S_CLK2, and outputs the second data signal S_DATA2 obtained by analog-converting the first data signal. The second data signal S_DATA2 is applied to a plurality of data lines (not shown) of a display panel (not shown). The second data signal S_DATA2 applies a gradation voltage or gradation current corresponding to the first data signal S_DATA1 to the data lines. The display panel may be, for example, a liquid crystal display (LCD) panel, a plasma display panel (PDP), or an organic electro-luminescence display (OELD) panel. A change of the second data signal S_DATA2 is controlled by the load signal TP.

FIG. 2 illustrates an example of the multi-level detector 10 employed in the data driver circuit of FIG. 1, showing a case in which the received signal S_R is transmitted by differential signaling. In this case, the received signal S_R is separated into a first signal S_R_P and a second signal S_R_N having opposite polarities. FIG. 3 is a timing diagram of the received signals S_R_P (bold line) and S_R_N (fine line), reference voltages V_REF_H and V_REF_L, the first clock signal S_CLK1 and the first data signal S_DATA1. Referring to FIGS. 2 and 3, the multi-level detector 10 includes a clock extractor 11 and a data extractor 12.

The clock extractor 11 compares the received signals S_R_P and S_R_N with the reference voltages V_REF_H and V_REF_L (V_REF_H is higher than V_REF_L), and generates the first clock signal S_CLK1 according to the result. To this end, the clock extractor 11 includes a first comparator 15, a second comparator 16 and an OR gate 17. When the first signal S_R_P is larger than the first reference voltage V_REF_H, and the second signal S_R_N is smaller than the second reference voltage V_REF_N, the first comparator 15 outputs a logic value of 1. Otherwise, the first comparator 15 outputs a logic value of 0. When the second signal S_R_N is larger than the first reference voltage V_REF_H, and the first signal S_R_P is smaller than the second reference voltage V_REF_N, the second comparator 16 outputs a logic value of 1. Otherwise, the second comparator 16 outputs a logic value of 0. The OR gate 17 receives the outputs of the first and second comparators 15 and 16 and performs an OR operation.

The data extractor 12 including a comparator 18 compares the first and second signals S_R_P and S_R_N with each other and outputs the first data signal S_DATA1 having a logic value of 0 or 1 according to the result.

FIG. 4 illustrates an example of the mask signal generator 20 employed in the data driver circuit of FIG. 1, and FIG. 5 is a timing diagram of the load signal TP, the second clock signal S_CLK2, the mask signal S_MASK and a counter output CNT[2:1]. Referring to FIGS. 4 and 5, the mask signal generator 20 includes a counter 21, a NAND gate 22 and an AND gate 23.

Referring to FIG. 4, the counter 21 receives the output of the AND gate 23 through a clock terminal CLK and the load signal TP through a reset terminal RS. Thus, the counter 21 performs counting in response to the output of the AND gate 23 and performs reset in response to the load signal TP. The NAND gate 22 performs a NAND operation on bits included in the counter output CNT[2:1], thereby generating the mask signal S_MASK. The AND gate 23 performs an AND operation on the mask signal S_MASK and the second clock signal S_CLK2.

FIGS. 4 and 5 illustrates an example in which the mask signal S_MASK is generated, that is, activated upon reception of the load signal TP and maintained for three clocks of the second clock signal S_CLK2, that is, until a third rising edge. However, this can be changed in various ways. For example, the generated mask signal S_MASK may be maintained for seven clocks of the second clock signal S_CLK2 (in this case, a three-bit counter must be used).

FIG. 6 illustrates an example of the DLL 30 employed in the data driver circuit of FIG. 1, and FIG. 7 is a timing diagram of the first clock signal S_CLK1, the second clock signal S_CLK2, signals UP and DN corresponding to a phase difference output from a phase detector 31, the mask signal S_MASK, signals UP' and DN' corresponding to a phase difference output from a switch 34, and an output V_LPF of a low-pass filter (LPF) 32. Referring to FIGS. 6 and 7, the DLL 30 includes the phase detector 31, the LPF 32, a delay line 33 and the switch 34.

The phase detector 31 functions to obtain a phase difference between the first and second clock signals S_CLK1 and S_CLK2. The phase difference may be output using the two signals UP and DN as shown in FIG. 6 and FIG. 7, or using one signal unlike the drawings. In the example shown in the drawings, a case in which the signals UP and DN are 0 and 1 respectively denotes that the first clock signal S_CLK1 is delayed relative to the second clock signal S_CLK2. A case in which the signals UP and DN are 1 and 0 respectively denotes that the first clock signal S_CLK1 leads the second clock signal S_CLK2. A case in which the signals UP and DN are 0 and 0 respectively denotes that the first clock signal S_CLK1 is the same as the second clock signal S_CLK2. Various phase detectors may be used as the phase detector 31. For example, a switch-type phase detector employing a multiplier, an exclusive OR gate, etc., or a sequential phase detector employing a latch, a flip-flop, etc., may be used.

The switch 34 transmits the signals UP and DN obtained from the phase detector 31 to the LPF 32 or blocks the signals UP and DN obtained from the phase detector 31 according to the mask signal S_MASK. More specifically, the switch 34 transmits the signals UP and DN obtained from the phase detector 31 to the LPF 32 while the mask signal S_MASK is not applied (not activated), and does not transmit the signals UP and DN obtained from the phase detector 31 to the LPF 32 while the mask signal S_MASK is applied (activated). While the mask signal S_MASK is applied, the switch 34 may transmit the signals UP' and DN' of 0 and 0 corresponding to the case in which there is no phase difference between the first and second clock signals S_CLK1 and S_CLK2 to the LPF 32.

The LPF 32 functions to remove high-frequency components from the output signals UP' and DN' of the switch 34. The LPF 32 shown in FIG. 6 outputs the voltage V_LPF having a level corresponding to the phase difference from which the high-frequency components are removed.

The delay line 33 derives the second clock signal S_CLK2 by delaying the first clock signal S_CLK1, and the delay of the delay line 33 is controlled by the output of the LPF 32. The delay line 33 shown in FIG. 6 is a voltage-controlled delay line whose delay is controlled by the voltage V_LPF output from the LPF 32.

FIG. 8 illustrates another example of the DLL 30 employed in the data driver circuit of FIG. 1, and FIG. 9 is a timing diagram of the first clock signal S_CLK1, the second clock signal S_CLK2, the signals UP and DN corresponding to a phase difference output from a phase detector 31A, the mask signal S_MASK, and the output V_LPF of the LPF 32. Referring to FIGS. 8 and 9, the DLL 30 includes the phase detector 31A, the LPF 32 and the delay line 33.

The phase detector 31A functions to output a phase difference between the first and second clock signals S_CLK1 and S_CLK2 or output a predetermined signal corresponding to a case in which there is no phase difference between the first and second clock signals S_CLK1 and S_CLK2, according to the mask signal S_MASK. The phase difference may be output using the two signals UP and DN as shown in FIG. 8 and FIG. 9, or using one signal unlike the drawings. In the example shown in the drawings, when the mask signal S_MASK is applied (activated), the phase detector 31A outputs the signals UP and DN as 0 and 0 corresponding to a case in which there is no phase difference between the first and second clock signals S_CLK1 and S_CLK2. On the other hand, when the mask signal S_MASK is not applied (not activated), the phase detector 31A outputs the signals UP and DN corresponding to a phase difference between the first and second clock signal S_CLK1 and S_CLK2. More specifically, when the first clock signal S_CLK1 is delayed relative to the second clock signal S_CLK2, the signals UP and DN are output as 0 and 1. When the first clock signal S_CLK1 leads the second clock signal S_CLK2, the signals UP and DN are output as 1 and 0. When the first clock signal S_CLK1 is the same as the second clock signal S_CLK2, the signals UP and DN are output as 0 and 0.

The LPF 32 functions to remove high-frequency components from the outputs UP and DN of the phase detector 31A.

The delay line 33 derives the second clock signal S_CLK2 by delaying the first clock signal S_CLK1, and the delay of the delay line 33 is controlled by the output V_LPF of the LPF 32.

FIG. 10 illustrates an example of the phase detector 31A employed in FIG. 8. Referring to FIG. 10, the phase detector 31A includes a first D flip-flop 61, a second D flip-flop 62, an AND gate 63 and an OR gate 64.

The first D flip-flop 61 outputs a value of 1 when the first clock signal S_CLK1 applied to its clock terminal CLK rises, and a value of 0 when the output of the OR gate 64 applied to its reset terminal RS becomes 1. The second D flip-flop 62 outputs a value of 1 when the second clock signal S_CLK2 applied to its clock terminal CLK rises, and a value of 0 when the output of the OR gate 64 applied to its reset terminal RS becomes 1. The AND gate 63 performs an AND operation on the outputs of the first and second D flip-flops 61 and 62, and the OR gate 64 performs an OR operation on the output of the AND gate 63 and the mask signal S_MASK.

The phase detector 31A illustrated in FIG. 10 is constituted as described above. Thus, every time the mask signal S_MASK is applied (activated), the phase detector 31A outputs the signals UP and DN as 0 and 0 regardless of a phase difference between the first and second clock signals S_CLK1 and S_CLK2.

FIG. 11 illustrates yet another example of the DLL 30 employed in the data driver circuit of FIG. 1, and FIG. 12 is a timing diagram of the first clock signal S_CLK1, the second clock signal S_CLK2, the signals UP and DN corresponding to a phase difference output from the phase detector 31, the mask signal S_MASK and an output V_LPF of an LPF 32A. Referring to FIGS. 11 and 12, the DLL 30 includes the phase detector 31, the LPF 32A and the delay line 33.

The phase detector 31 outputs the signals UP and DN corresponding to a phase difference between the first and second clock signals S_CLK1 and S_CLK2.

The LPF 32A removes high-frequency components from the outputs UP and DN of the phase detector 31, or stops operating according to the mask signal S_MASK. More specifically, when the mask signal S_MASK is not applied (not activated), the LPF 32A removes high-frequency components from the outputs UP and DN of the phase detector 31, and when the mask signal S_MASK is applied (activated), the LPF 32A stops operating. Here, in the event that the LPF 32A stops operating, the output of the LPF 32A is not dependent on the input, that is, the output of the phase detector 31, but this does not mean that none of the components of the LPF 32A operate or that the output of the LPF 32A is fixed at a specific value.

The delay line 33 derives the second clock signal S_CLK2 by delaying the first clock signal S_CLK1, and the delay of the delay line 33 is controlled by the output V_LPF of the LPF 32A.

FIG. 13 is an example of a circuit diagram of the LPF 32A employed in FIG. 11. Referring to FIG. 13, the LPF 32A includes an inverter 71, a p-channel metal-oxide semiconductor (PMOS) transistor 72, an n-channel metal-oxide semiconductor (NMOS) transistor 73, a resistor 74, a capacitor 75 and a switch 76.

The inverter 71 inverts the signal UP. A power supply voltage VDD is applied to the source of the PMOS transistor 72, the output of the inverter 71 is applied to the gate the PMOS transistor 72, and the drain the PMOS transistor 72 is connected to a first node N1. A ground voltage is applied to the source of the NMOS transistor 73, the signal DN is applied to the gate the NMOS transistor 73, and the drain the NMOS transistor 73 is connected to the first node N1. The resistor 74 is connected between a second node N2 and the capacitor 75. The resistor 74 is connected to one end of the capacitor 75, and the ground voltage is applied to the other end. The switch 76 connects the first node N1 with the second node N2 according to the mask signal S_MASK. More specifically, when the mask signal S_MASK is applied (activated), the switch 76 connects the first and second nodes N1 and N2 with each other. On the other hand, when the mask signal S_MASK is not applied (not activated), the switch 76 disconnects the first node N1 from the second node N2.

The LPF 32A illustrated in FIG. 13 is constituted as described above. Thus, when the mask signal S_MASK is applied (activated), the switch 76 disconnects the first node N1 from the second node N2, thereby uniformly maintaining the voltage of the capacitor 75, that is, the output voltage V_LPF of the LPF 32A.

FIG. 14 illustrates an example of the data driver 40 employed in the data driver circuit of FIG. 1, and FIG. 15 is a timing diagram of first to fourth data signals S_DATA1, S_DATA2, S_DATA3 and S_DATA4, the second clock signal S_CLK2 and the load signal TP. Referring to FIGS. 14 and 15, the data driver 40 includes a sampler 41, a latch 42 and a digital-to-analog converter (DAC) 43.

The sampler 41 samples the first data signal S_DATA1 according to the second clock signal S_CLK2. Since the first data signal S_DATA1 and the second clock signal S_CLK2 are synchronized with the first clock signal S_CLK1, it is possible to accurately sample the first data signal S_DATA1 according to the second clock signal S_CLK2. To sample the first data signal S_DATA1 using the second clock signal S_CLK2, the periods of the second clock signal S_CLK2 and the first data signal S_DATA1 do not have to be the same. FIG. 15 illustrates a case in which the first data S_DATA1 of four bits is input during one period of the second clock signal S_CLK2. In this case, the sampler 41 may include a circuit capable of increasing the frequency of the second clock signal S_CLK2. In addition, the DLL 30 may transmit the second clock signal S_CLK2 and an additional second clock signal (not shown) having a phase difference with respect to the second clock signal S_CLK2 to the sampler 41, and the sampler 41 may perform sampling using them. As illustrated in FIG. 15, when the first data S_DATA1 of four bits is input during one period of the second clock signal S_CLK2, the additional second clock signal may include a clock signal obtained by shifting the second clock signal S_CLK2 by ¼ period, a clock signal obtained by shifting the second clock signal S_CLK2 by 2/4 period, and a clock signal obtained by shifting the second clock signal S_CLK2 by ¾ period. The additional second clock signal may be output from the delay line 33.

The latch 42 stores the output S_DATA3 of the sampler 41 in sequence, and then outputs it in parallel in response to the load signal TP. For example, the output S_DATA4 of the latch 42 is separated into N signals each of eight bits. Here, N is the number of data lines of the display panel. In FIG. 15, an N-th signal S_DATA4[N] of the fourth data signal S_DATA4 is expressed in hexadecimal notation.

The DAC 43 transmits the second data signal S_DATA2 obtained by analog-converting the output S_DATA4 of the latch 42 to the display panel (not shown). For example, the output S_DATA2 of the DAC 43 is separated into N signals. In FIG. 15, an N-th signal S_DATA2[N] of the second data signal S_DATA2 is illustrated.

The load signal TP does not have to be input to the latch 42 as illustrated in FIG. 14. For example, the load signal TP may be input to the DAC 43. In this case, the DAC 43 temporarily may store the analog-converted second data signal S_DATA2 and then output the stored second data signal S_DATA2 to the display panel in response to the load signal TP.

FIG. 16 is a block diagram of a data driver circuit according to a second example embodiment of the present invention, illustrating a case in which a first clock signal and a first data signal are received through different signal lines.

Referring to FIG. 16, the data driver circuit includes a mask signal generator 20, a DLL 30 and a data driver 40. The data driver circuit shown in FIG. 16 is almost the same as the data driver circuit shown in FIG. 1 except that it does not include the multi-level detector 10, and the first data signal S_DATA1 has several bits, e.g., 8 bits. Thus, a detailed description of the data driver circuit shown in FIG. 16 will be omitted.

A data driver circuit according to an example embodiment of the present invention can keep a DLL locked even if a part of a first clock signal transmitted from a timing controller is not restored due to a change of a second data signal output to a display panel. More specifically, a mask signal generator included in the data driver circuit according to an example embodiment of the present invention applies a mask signal to the DLL while the first clock signal may be compromised, and the DLL prevents a change in delay that depends on a phase difference according to the mask signal, thereby preventing the DLL from being unlocked. The first clock signal may be easily compromised when embedded in a first data signal with a different signal magnitude. In this case, that is, when the first clock signal is embedded at multi-levels, the data driver circuit according to an example embodiment of the present invention is useful.

In addition, a delay-locked loop circuit including a mask signal generator and a DLL according to an example embodiment of the present invention can be kept locked even if a part of an input first clock signal is compromised. More specifically, the mask signal generator included in the delay-locked loop circuit according to an example embodiment of the present invention applies a mask signal to the DLL while the first clock signal is in danger of being compromised, and the DLL prevents a change in delay that depends on a phase difference according to the mask signal, thereby preventing the DLL from being unlocked.

In addition, a data driver circuit and a delay-locked loop according to an example embodiment of the present invention can prevent a DLL from being unlocked.

While the invention has been shown and described with reference to certain example embodiments thereof, it will be understood by those skilled in the art that various changes in form and details may be made therein without departing from the spirit and scope of the invention as defined by the appended claims.

What is claimed is:

1. An apparatus comprising a data driver circuit, wherein:
   the data driver circuit is configured to receive a first data signal and a first clock signal;
   the data driver circuit is configured to output a second data signal to be transmitted to a display panel;

the data driver circuit comprises a data driver configured to sample the first data signal according to a second clock signal, obtain the second data signal by analog-converting the first data signal, and output the second data signal;

the data driver circuit comprises a mask signal generator configured to generate a mask signal, wherein the mask signal indicates presence within a predetermined time period measured from when the second data signal begins to change;

the data driver circuit comprises a delay-locked loop (DLL) configured to generate the second clock signal from the first clock signal; and there is a delay between the first clock signal and the second clock signals, the delay changes due to a phase difference between the first clock signal and the second clock signal, and the changes in the delay due to the phase difference is substantially prevented by the mask signal.

2. The apparatus of claim 1, wherein:
the mask signal is generated at least one of before the second data signal begins to change and at the time the second data signal begins to change; and
the mask signal is maintained for a predetermined period of time after being generated.

3. The apparatus of claim 1, wherein:
a load signal which causes the second data signal to change is applied to the data driver; and
the mask signal generator is configured to generate the mask signal in response to the load signal.

4. The apparatus of claim 3, wherein the data driver comprises:
a sampler configured to sample the first data signal according to the second clock signal;
a latch configured to store an output of the sampler in sequence and output the stored output in parallel in response to the load signal; and
a digital-to-analog converter (DAC) configured to output the second data signal obtained by analog-converting the output of the latch.

5. The apparatus of claim 1, wherein the DLL comprises:
a phase detector configured to obtain the phase difference;
a switch configured to at least one of transmit and block an output of the phase detector;
a low-pass filter (LPF) configured to remove high-frequency components from the output of the switch; and
a delay line configured to derive the second clock signal by delaying the first clock signal, wherein a delay of the delay line changes according to an output of the LPF.

6. The apparatus of claim 5, wherein the switch is configured to transmit a predetermined signal when there is no phase difference to the LPF while blocking the output of the phase detector.

7. The apparatus of claim 1, wherein the DLL comprises:
a phase detector configured to output at least one of the phase difference and a predetermined signal, wherein the predetermined signal indicates that there is no phase difference according to the mask signal;
a low-pass filter (LPF) configured to remove high-frequency components from the output of the phase detector; and
a delay line configured to derive the second clock signal by delaying the first clock signal, wherein a delay of the delay line changes according to an output of the LPF.

8. The apparatus of claim 1, wherein the DLL comprises:
a phase detector configured to obtain the phase difference;
a low-pass filter (LPF) configured to at least one of remove high-frequency components from an output of the phase detector and stop operation according to the mask signal; and
a delay line configured to derive the second clock signal by delaying the first clock signal, wherein a delay of the delay line changes according to an output of the LPF.

9. The apparatus of claim 1, wherein:
the first clock signal is embedded in the first data signal;
the first clock signal has a different signal magnitude than the first data signal; and
a received signal comprises the first clock signal and the first data signal.

10. The apparatus of claim 9, comprising a multi-level detector configured to extract the first clock signal from the received signal and transmit the extracted first clock signal to the DLL.

11. The apparatus of claim 10, wherein the multi-level detector extracts the first data signal and transmits the extracted first data signal to the data driver.

12. The apparatus of claim 9, wherein the first clock signal and the first data signal are transmitted by single-ended signaling using at least one of a single interconnection and by differential signaling using two interconnections.

13. An apparatus comprising a delay-locked loop (DLL) circuit, wherein the DLL comprises:
a DLL configured to generate a second clock signal from a first clock signal, wherein there is a delay between the first clock signal and the second clock signal that changes according to a phase difference between the first clock signal and the second clock signal; and
a mask signal generator configured to transmit a mask signal that prevents the delay from changing according to the phase difference.

14. The apparatus of claim 13, wherein the DLL comprises:
a phase detector configured to obtain the phase difference;
a switch configured to at least one of transmit and block an output of the phase detector according to the mask signal;
a low-pass filter (LPF) configured to remove high-frequency components from the output of the switch; and
a delay line configured to generate the second clock signal by delaying the first clock signal, wherein a delay of the delay line changes according to an output of the LPF.

15. The apparatus of claim 14, wherein the switch is configured to transmit a predetermined signal when there is no phase difference to the LPF while blocking the output of the phase detector.

16. The apparatus of claim 13, comprising:
a phase detector configured to output at least one of the phase difference and a predetermined signal, wherein the predetermined signal indicates that there is no phase difference according to the mask signal;
a low-pass filter (LPF) configured to remove high-frequency components from the output of the phase detector; and
a delay line configured to generate the second clock signal by delaying the first clock signal, wherein a delay of the delay line changes according to an output of the LPF.

17. The apparatus of claim 13, comprising:
a phase detector configured to obtain the phase difference;
a low-pass filter (LPF) configured to at least one of remove high-frequency components from an output of the phase detector and stop operation according to the mask signal; and a delay line configured to generate the second clock signal by delaying the first clock signal, wherein a delay of the delay line changes according to an output of the LPF.

18. An apparatus comprising a data driver circuit, wherein:

the data driver circuit is configured to receive a first data signal and a first clock signal;

the data driver circuit is configured to output a second data signal to be transmitted to a display panel;

the data driver circuit comprises a delay-locked loop (DLL) configured to generate a second clock signal from the first clock signal;

a delay between the first clock signal and the second clock signal changes according to a phase difference between the first clock signal and the second clock signal;

the delay between the first clock signal and the second clock signal does not change according to the phase difference after the second data signal begins to change; and the data driver circuit comprises a data driver configured to sample the first data signal in response to the second clock signal, obtain the second data signal by analog-converting the first data signal, and output the second data signal.

* * * * *